US009784555B2

(12) United States Patent
Spehlmann

(10) Patent No.: US 9,784,555 B2
(45) Date of Patent: Oct. 10, 2017

(54) DETERMINING ELECTRICAL PATH LENGTH

(71) Applicant: Teradyne, Inc., North Reading, MA (US)

(72) Inventor: Marc Spehlmann, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 52 days.

(21) Appl. No.: 14/952,441

(22) Filed: Nov. 25, 2015

(65) Prior Publication Data

US 2017/0146332 A1 May 25, 2017

(51) Int. Cl.
| | |
|---|---|
| *G01R 27/26* | (2006.01) |
| *G01B 7/02* | (2006.01) |
| *G01D 5/24* | (2006.01) |
| *G01R 31/319* | (2006.01) |
| *H03K 17/955* | (2006.01) |
| *G06K 9/00* | (2006.01) |

(52) U.S. Cl.
CPC ............. *G01B 7/02* (2013.01); *G01D 5/24* (2013.01); *G01R 27/2605* (2013.01); *G01R 31/3191* (2013.01); *G01R 31/31901* (2013.01); *G01R 27/26* (2013.01); *G06K 9/0002* (2013.01); *H03K 17/955* (2013.01)

(58) Field of Classification Search
CPC . G01B 7/00; G01B 7/02; G01B 7/026; G01B 21/00; G01B 21/02; G01R 27/00; G01R 27/02; G01R 27/26; G01R 27/2605; G01D 5/24; G01D 5/241; G01D 5/2412; G01D 5/2417; G06K 9/0002; H03K 17/955

USPC ....... 324/500, 512, 522, 600, 629, 633, 635, 324/642, 644, 649, 658, 661, 662, 663, 324/671, 691, 693, 699, 713, 715, 716; 702/1, 52, 57, 64
See application file for complete search history.

(56) References Cited

U.S. PATENT DOCUMENTS

| | | | | |
|---|---|---|---|---|
| 3,944,914 A | * | 3/1976 | Simmonds | G01R 31/024 324/519 |
| 4,103,225 A | | 7/1978 | Stephens | |
| 4,410,850 A | * | 10/1983 | Pesto | G01R 31/088 324/519 |
| 6,945,115 B1 | * | 9/2005 | Wang | G01L 9/0073 73/718 |

(Continued)

OTHER PUBLICATIONS

International Search Report for PCT/US2016/048527, 3 pages (dated Dec. 2, 2016).

(Continued)

*Primary Examiner* — Hoai-An D Nguyen
(74) *Attorney, Agent, or Firm* — Choate, Hall & Stewart LLP

(57) ABSTRACT

An example process for determining electrical path lengths includes: injecting current into a transmission line having a known capacitance per unit of length; determining a rate of change in voltage on the transmission line in response to the current; determining a capacitance of the transmission line based on the change in voltage; and determining an electrical path length of the transmission line based on the determined capacitance of the transmission line and the known capacitance per unit of length.

20 Claims, 5 Drawing Sheets

(56) References Cited

U.S. PATENT DOCUMENTS

| | | | |
|---|---|---|---|
| 2002/0048220 A1* | 4/2002 | Khuri-Yakub | B06B 1/0292 367/181 |
| 2004/0104730 A1* | 6/2004 | Taylor | G01R 31/088 324/525 |
| 2004/0252555 A1* | 12/2004 | Shor | G11C 16/08 365/185.22 |
| 2006/0236157 A1 | 10/2006 | Huang et al. | |
| 2011/0181370 A1 | 7/2011 | Guilar | |
| 2012/0313618 A1 | 12/2012 | Phillips | |
| 2014/0021963 A1 | 1/2014 | Cole | |

OTHER PUBLICATIONS

Written Opinion for PCT/US2016/048527, 5 pages (dated Dec. 2, 2016).

\* cited by examiner

DETERMINING ELECTRICAL PATH LENGTH

TECHNICAL FIELD

This specification relates generally to determining the electrical path length of a transmission line based on a capacitance of the transmission line.

BACKGROUND

Automatic test equipment (ATE) includes electronics for sending signals to, and receiving signals from, a device under test (DUT) in order to test the operation of the DUT. The ATE includes test instruments, such as digital test instruments for performing digital tests on integrated circuits. The test instruments typically reside on a test head. A device interface board (DIB), which is typically provided by the DUT manufacturer and not manufactured with the ATE, connects the test head, and thus the test instruments, to the DUT. Transmission lines pass through the DIB; however, the ATE does not know the electrical path length of those transmission lines. This information, however, can be useful for various purposes including, but not limited to, aligning signals and determining signal line continuity.

TDR (time domain reflectometry) may be used to align signals at the end of a transmission line or to determine electrical continuity. However, TDR may be unreliable under certain circumstances, e.g., when signal rise times exceed the electrical path length of a transmission line. Furthermore, the ATE may not be capable of performing a TDR measurement.

SUMMARY

An example process for determining electrical path lengths includes: injecting current into a transmission line having a known capacitance per unit of length; determining a rate of change in voltage (e.g., dV/dt) on the transmission line in response to the current; determining a capacitance of the transmission line based on the rate of change in voltage; and determining an electrical path length of the transmission line based on the determined capacitance of the transmission line and the known capacitance per unit of length. The example process may include one or more of the following features, either alone or in combination.

The example process may also comprise performing signal alignment based on the electrical path length. Performing signal alignment may comprise controlling signal output to the transmission line and one or more other transmission lines so that rising and/or falling edges of signals on the transmission line and one or more other transmission lines occur at a same time or within a specified interval at outputs of the transmission line and the one or more other transmission lines.

The transmission line may comprise a signal path between a test instrument and a device under test. The signal path may be on a device interface board that is configured to connect the test instrument to the device under test. The electrical path length may be less than a rise time of a signal for which alignment is performed.

The example process may include detecting a characteristic of the transmission line based on the electrical path length. The characteristic of the transmission line may be a short circuit in a signal line that includes the transmission line; and detecting the characteristic may comprise recognizing that the capacitance or the electrical path length exceeds a predefined threshold. The characteristic of the transmission line may comprise a break in a signal line that includes the transmission line; and detecting the characteristic comprises recognizing that the capacitance or the electrical path length is below a predefined threshold. The characteristic of the transmission line may comprise a termination point of the transmission line; and detecting the termination point may comprise determining through which of the multiple devices the transmission line extends based on the capacitance or the electrical path length. Determining the termination point may comprise: comparing a known value associated with one or more of the multiple devices to the determined electrical path length or the capacitance; and identifying a device to which the transmission line extends based on the comparing.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
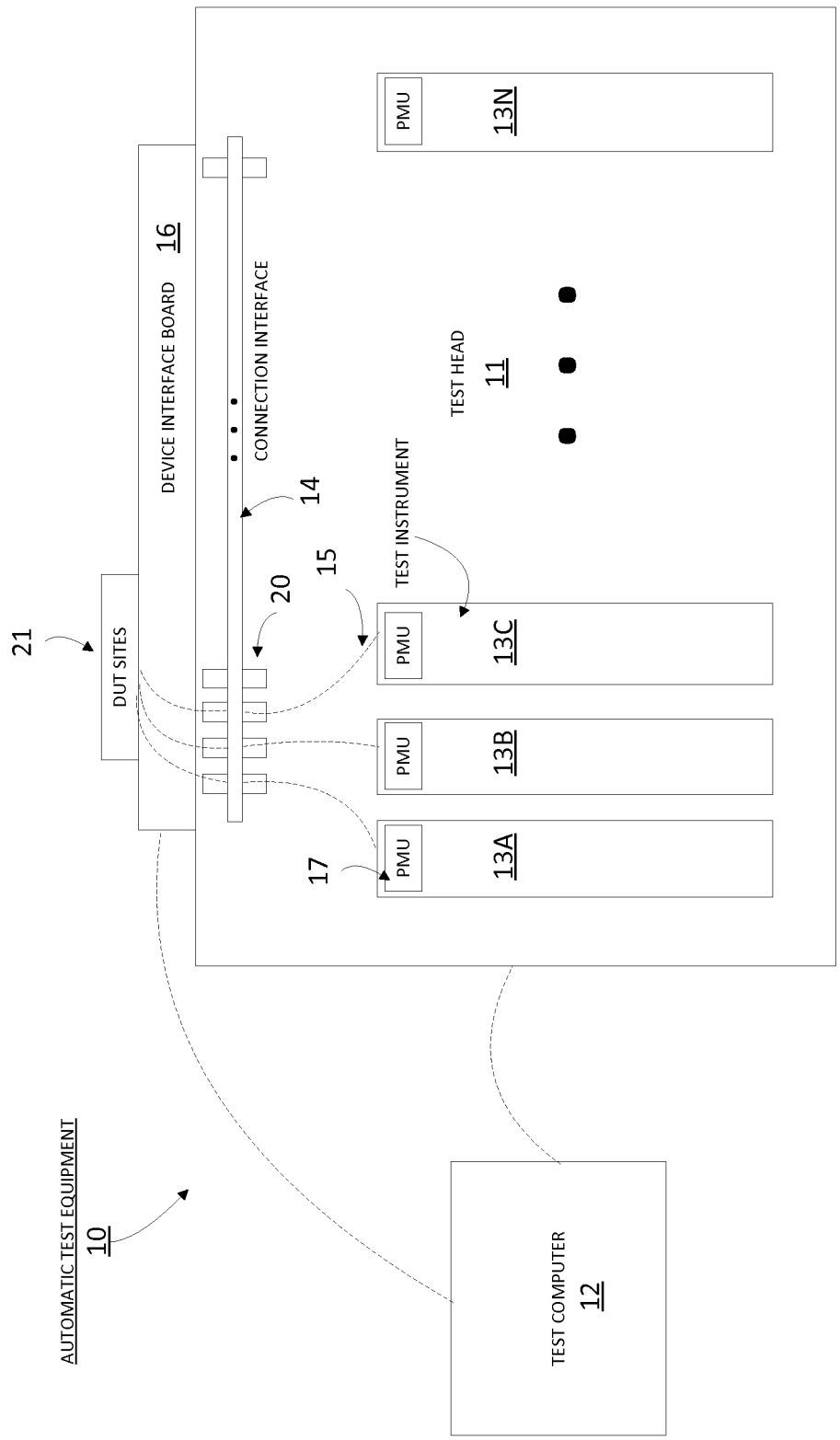
FIG. 1 is a block diagram of an example test system.

Described herein is example ATE that may be configured to determine an electrical path length of a transmission line, such as a transmission line through a DIB, and to use that information for purposes including, but not limited to, signal alignment and detection of breaks or short circuits in the transmission line. The example ATE is configured to inject current into the transmission line, which has a known capacitance per unit of length; to detect a change in voltage over time (the rate of change of the voltage) on the transmission line in response to the current; to determine a capacitance of the transmission line based on the change in voltage over time; and to determine an electrical path length of the transmission line based on the determined capacitance of the transmission line and the known capacitance per unit of length. In this example, the electrical path length refers to the distance on the transmission line over which electrical signals pass between two points.

An example transmission line having a controlled impedance has a fixed capacitance per unit of length. For example, a common transmission line is a 50Ω etch on a printed circuit board (PCB) made of FR4. FR4 is a PCB composite substrate material comprised of woven fiberglass cloth having an epoxy resin binder that is flame resistant In some examples, the fixed capacitance per unit of length about 3.3 (picoFarads)/inch; this ratio is constant; and this ratio does not vary with the geometry of the etch. Accordingly, the length of the transmission line can be discerned by determining the capacitance of the transmission line.

In this regard, in some implementations, ATE is particularly well suited to measure small capacitances. For example, ATE is capable of accurately sourcing small currents, below a 1 uA, accurately measuring voltages, and accurately measuring small intervals of time, below 1 us, or measuring voltage at a fixed time interval. For example, for each inch of a sample transmission line, a 1 uA current source results in a 0.6V difference between two voltage measurements separated by 2 us. Alternatively, for each inch of a sample transmission line, a 1 uA current source results in a 3.3 us difference between two time measurements separated by 1V. In the first case, voltages are measured at a known interval. In the second case, the time between a signal crossing two voltage thresholds is measured.

The example ATE described herein is configured to source small currents into the transmission line, and to measure times of electrical signal transitions on the transmission line in response to those currents. More specifically, when the current is injected into a transmission line, the voltage (V) on the transmission line will change according to the known relationship $dV/dt=i/C$, where i represents current, C represents capacitance, and $dV/dt$ represents the rate of change in voltage (V), e.g., the change in voltage (V) over time (t). Since i is known, and $dV/dt$ can be determined as described herein, C can also be determined. When C is known, the electrical path length of the transmission line can be determined, as described with respect to process 30 of FIG. 2.

The example process for determining electrical path length may be particularly useful when a high speed digital signal is not available. In this regard, words such as "high" and "low" used herein have no specific numerical connotations. Rather, such words indicate relative relationships between two values. In some examples, when the electrical path length of a transmission line is more than the rise time of a signal, that signal is deemed to be high speed. In some examples, when the electrical path length of a transmission line is less than the rise time of a signal or less than a quarter of the rise time when the circuit behaves ideally, that signal is deemed low speed. The example ATE and process to determine electrical path length are particularly (although not exclusively) applicable for low speed signals, since TDR can produce errors for low speed signals. More specifically, if a digital source cannot drive a waveform having edges that transition quickly enough, the reflection from the end of the line (in TDR) overlaps the source edge, and the electrical path length of the transmission line is not determined accurately. Using typical TDR parameters in ideal conditions, this overlap occurs when the electrical path length is less than one quarter of the rise time of the TDR signal. For example, a TDR signal with a rise time of 10 ns (nanoseconds) cannot be used to measure path lengths less than approximately 15 inches. By increasing the accuracy with which electrical path lengths are determined, particularly for signals whose rise times are longer than their path lengths, it may be possible to more closely align signals on different transmission lines, and to more accurately identify breaks or shorts on transmission lines.

In some cases, a transmission line having an electrical path length that is shorter than expected may be broken (e.g., include an open circuit). Broken transmission lines may be caused by mechanical failures, such as stuck relays or poor contact between parts of the transmission line. In some cases, a transmission line having an electrical path length that is longer than expected may indicate that there is a short circuit on, or affecting, the transmission line. Information about open circuits and/or short circuits may be used by the ATE to identify a transmission line for repair or to alter test protocols to avoid the transmission line that is includes the open circuit or the short circuit.

The electrical path length determined using the example processes described herein may also be used to align timing between signals on different transmission lines. For example, if electrical path lengths of several transmission lines are determined, timing between signals on each of those transmission line may be adjusted so that, e.g., rising and/or falling edges of signals on a transmission line and one or more others of the transmission lines occur at a same time or within a specified interval at outputs of all transmission lines.

FIG. 1 shows components of example ATE 10 that is configured to perform process 30 to determine electrical path lengths of one or more transmission lines. Notably, however, process 30 is not limited to use with the ATE of FIG. 1 or to use with any particular type of ATE, but rather may be used in any appropriate technical context, including outside of a testing environment. In the example of FIG. 1, the dashed lines indicate potential signal paths between devices.

ATE 10 includes a test head 11 and a test computer 12. Test head 11 communicates with DUTs (not shown in FIG. 1) on which tests are performed. Test computer 12 communicates with test head 11 to control testing and, in some cases directly or indirectly with the DUTs. In an example, test computer 12 may download test program sets to test instruments on the test head, which then run the test program sets to test DUTs in communication with the test head.

Test computer 12 may be any appropriate type of computing device or devices having memory storing instructions that comprise one or more computer programs, and one or more processing devices to execute those instructions. The one or more computer programs executing on test computer 12 may obtain information for a transmission line including, e.g., i (current), C (known capacitance/unit length) and $dV/dt$ (change in voltage versus time), and determine the electrical path length of the transmission line based on that information. This electrical path length may be used, as described herein, to align signals on multiple transmission lines, to identify breaks (open circuits) or shorts (short circuits) in the transmission line, and/or to control or alter testing based on the determinations.

ATE 10 includes test instruments 13A to 13N. In some examples, one or more of the test instruments include, but are not limited to, digital test instruments for performing digital tests on integrated circuits. However, other types of test instruments may be used in lieu of, or in addition to, digital test instruments. Each test instrument may be configured to output test signals to test a DUT, and to receive signals from the DUT. The signals received may include response signals that are based on the test signals and/or signals that originate from the DUT that are not prompted by (e.g., are not in response to) test signals. In some implementations, each test instrument, such as test instrument 13A, includes one or more parametric measurement units (PMU) 17. Generally, a PMU is circuitry that includes one or more programmable modes to force (e.g., output) a pin voltage to a transmission line and to measure the resulting current on the transmission line, or to force a current on the transmission line, and to measure the resulting voltage on the transmission line. In the example processes described herein for determining electrical path length, the PMU forces a small amount of current onto a transmission line, and the resulting rate of change in voltage (e.g., dV/dt) on the transmission line is detected.

ATE 10 includes a connection interface 14, which connects test instrument outputs 15 to a DIB 16. Connection interface 14 may include connectors 20 or other devices for routing signals between the test instruments and DIB 16. For example, the connection interface may include one or more circuit boards or other substrates on which such connectors are mounted. Other types of connections may be used.

In the example of FIG. 1, DIB 16 connects, electrically and mechanically, to the connection interface of test head 11. DIB 16 includes sites 21, which may include pins, traces, or other points of electrical and mechanical connection to which DUTs may connect. Test signals, response signals, and other signals pass over the sites between the DUT and test instruments. DIB 16 also includes, among other things, connectors, conductive traces, and circuitry for routing signals between the test instruments, DUTs connected to sites 21, and other circuitry.

Figure 3:
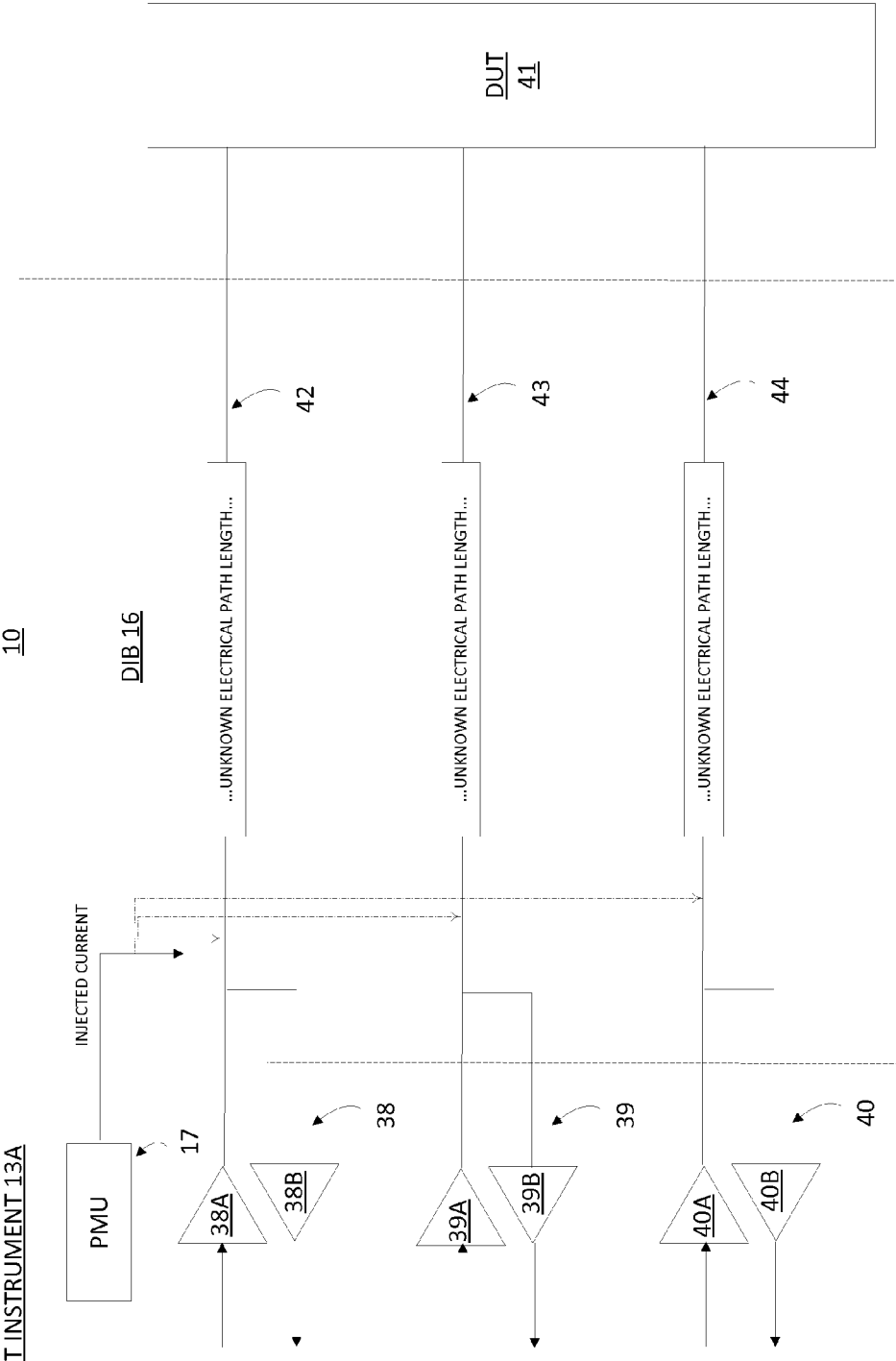
FIG. 3 is a block diagram showing channels of the test equipment connected to transmission lines of a DIB.

While the DIB may be considered part of the ATE, the DIB is not typically provided by the same entity that provides the test head and test computer. Instead, the DIB is typically provided by the manufacturer of the DUT that is being tested by the ATE. The manufacturer of the rest of the ATE, e.g., the test head 11 and test computer 12, does not typically know, to sufficient precision, the electrical path lengths of transmission lines through the DIB to the DUT. For example, as shown in FIG. 3, a test instrument 13a having test channels 38, 39, 40 connects to DUT 41 through DIB 16. Each test channel includes a driver 38A, 39A, 40A to output digital logic levels and a corresponding receiver 38B, 39B, 40B, such as a comparator, to determine/measure the result on the transmission line in response to the output.

DIB 16 includes transmission lines 42, 43, 44 that connect to respective test channels 38, 39, 40, and that have electrical path lengths that are unknown to the manufacturer of the test instrument. Example ATE 10 and process 30 performed thereby enable determination of the total electrical path length of transmission lines 42, 43, 44, including in cases where signal rise time exceeds the electrical path length. As a result, in those cases, electrical path lengths can be determined with some measure of accuracy. Notably, however, example ATE 10 and process 30 also enable determination of electrical path lengths of transmission lines 42, 43, 44 in cases where signal rise time is less than the electrical path length. As described herein, example ATE 10 and process 30 also enable detection of open circuits and/or short circuits in transmission lines 42, 43, 44, and enable appropriate responsive coordination and adjustment of testing.

Figure 2:
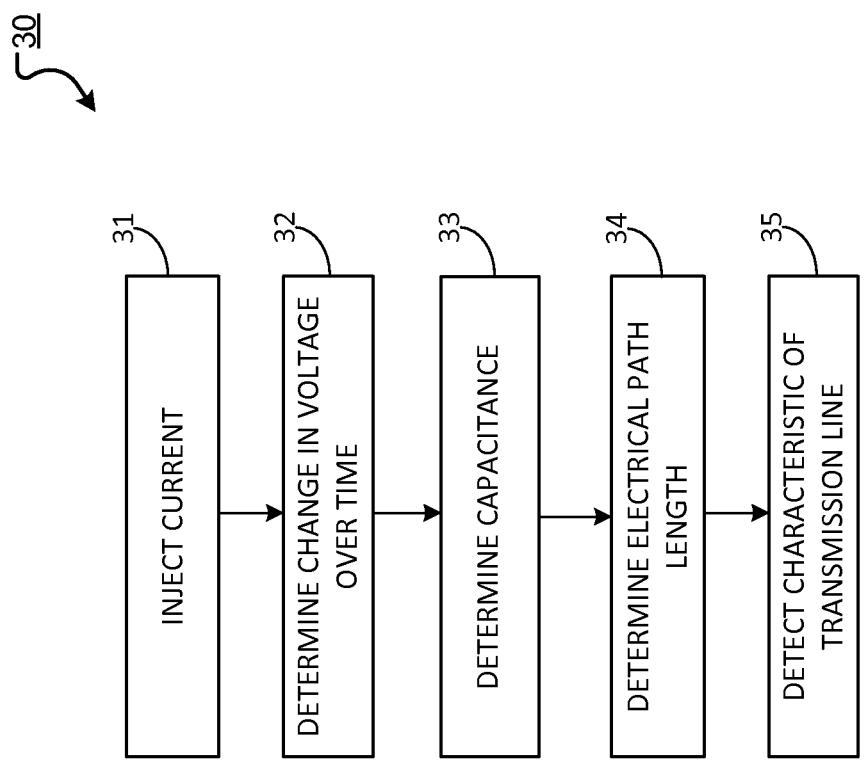
FIG. 2 is a flowchart showing an example process that may be performed by the test system to determine electrical path length of a transmission line.
Figure 4:
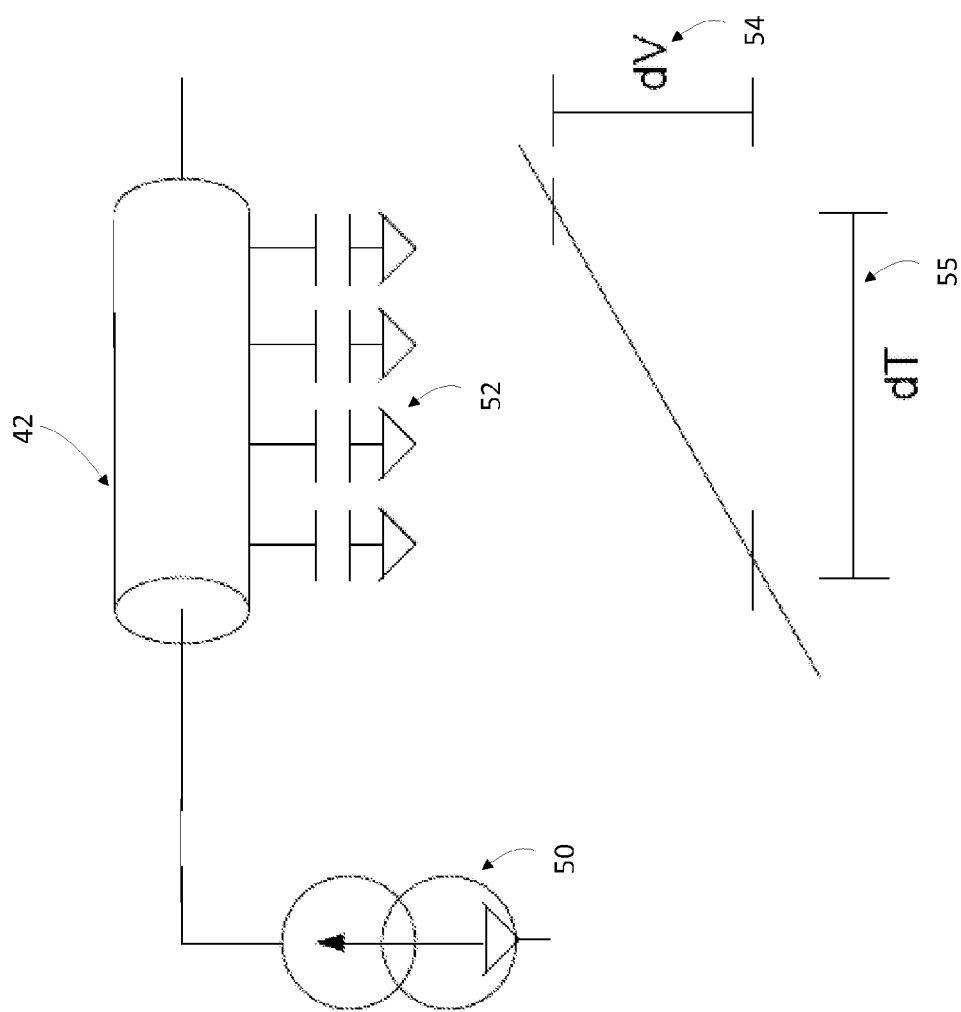
FIG. 4 is a block diagram showing, conceptually, parallel capacitance in a transmissions line.

Referring also to FIGS. 2 and 4, a current source 50 (in this example, a PMU 17) is connected to a transmission line 42. In this example, the transmission line is a circuit path through DIB 16; however, in other examples, the transmission line may include additional traces, such as, but not limited to, part(s) of the test instrument channel and traces on the DUT. Current source 50 injects (31) a known current (i) into transmission line 42 which, as indicated, has a known capacitance per unit of length. In this example, the current source is a PMU; however, process 30 is not limited to using a PMU as the current source. In this example, the known capacitance per unit length of transmission line 41 is 3.3 pf/inch; however process 30 is not limited to use with these values. This known capacitance per unit length is depicted conceptually in FIG. 4 by capacitors 52, which represent the known capacitance in each unit length but which are not actually discrete devices as depicted in FIG. 4. The known capacitance of the transmission line can thus be modeled as a number "x" of parallel capacitors.

In this example, receiver 38b in the test instrument detects a voltage (V) on the transmission line, and provides that voltage to the test computer, which is programmed to determine (32) the change in voltage (dV 54) on the transmission line over time (dt 55) in response to the current. In this example, the receiver may be a comparator that detects a voltage on the transmission line relative to a reference voltage. In some implementations, circuitry other than, or in addition to, a comparator may be used to detect the voltage on the transmission line. Test computer 12 may keep running track of the voltage on transmission line 42, and identify the change in voltage over time based on the output of receiver 38B.

Test computer 12 determines (33) the capacitance (C) of the transmission line based on the rate of change in voltage (dV/dt). In this example, test computer 12 executes one or more computer programs to perform calculations to determine the capacitance (C) of the transmission line based on the relationship: dV/dt=i/C, where dV/dt and i are the measured values. The determined capacitance, C, in this case is the entire capacitance of the transmission line.

Test computer 12 determines (34) an electrical path length of the entire transmission line based on the determined capacitance (C) of the transmission line and the known capacitance per unit of length (in this example, 3.3 pf/inch). More specifically, the test computer uses the known relationship defining parallel capacitance, namely:

$$C_{total}=C_1+C_2 \ldots +C_N, \text{ where } N>2$$

In this example, $C_{total}$ is the capacitance (C) determined for the transmission line. In this example, $C_1 \ldots C_N$ are each 3.3 pF, although this number may be different in other examples. Furthermore, since each unit length (in this example, inches) is 3.3 pF, the above equation reduces to $$C_{total}=3.3 \cdot x,$$

where x is the number of capacitors and also unit lengths. Accordingly, knowing the value of $C_{total}$, test computer determines the value of "x". In this example, "x" is the electrical path length, in inches, of the transmission line from the output of the test instrument 13a to the DUT, including the part of the transmission line extending through the DIB. In some cases, e.g., where the unit length is not "one", then the actual length may be a product of x and the unit length.

A characteristic of the transmission line may be detected (35), e.g., by test computer 12, based on the capacitance or the determined electrical path length. In some implementations, the characteristic of the transmission line includes a short circuit in a signal line that includes the transmission line, and detecting the characteristic includes recognizing that the capacitance exceeds a predefined threshold. For example, the test computer may compare the capacitance of the transmission line, or a portion thereof, to a predefined threshold. If the detected capacitance exceeds the predefined threshold that is indicative of a short circuit on the transmission line. In some examples, detecting the characteristic includes determining that the determined electrical path length exceeds a defined threshold.

In some implementations, the characteristic of the transmission line includes a break, or open circuit, in a signal line that includes the transmission line; and detecting the characteristic includes recognizing that the capacitance is below a predefined threshold. For example, the test computer may compare the capacitance of the transmission line, or a portion thereof, to a predefined threshold. If the capacitance is less than the predefined threshold (e.g., the transmission line is too short), that is indicative of a break, or open circuit, on the transmission line. In some examples, detecting the characteristic includes determining that the determined electrical path length is below a defined threshold. Furthermore, if the transmission line has a controlled impedance, the location of the break may also be determined.

Figure 5:
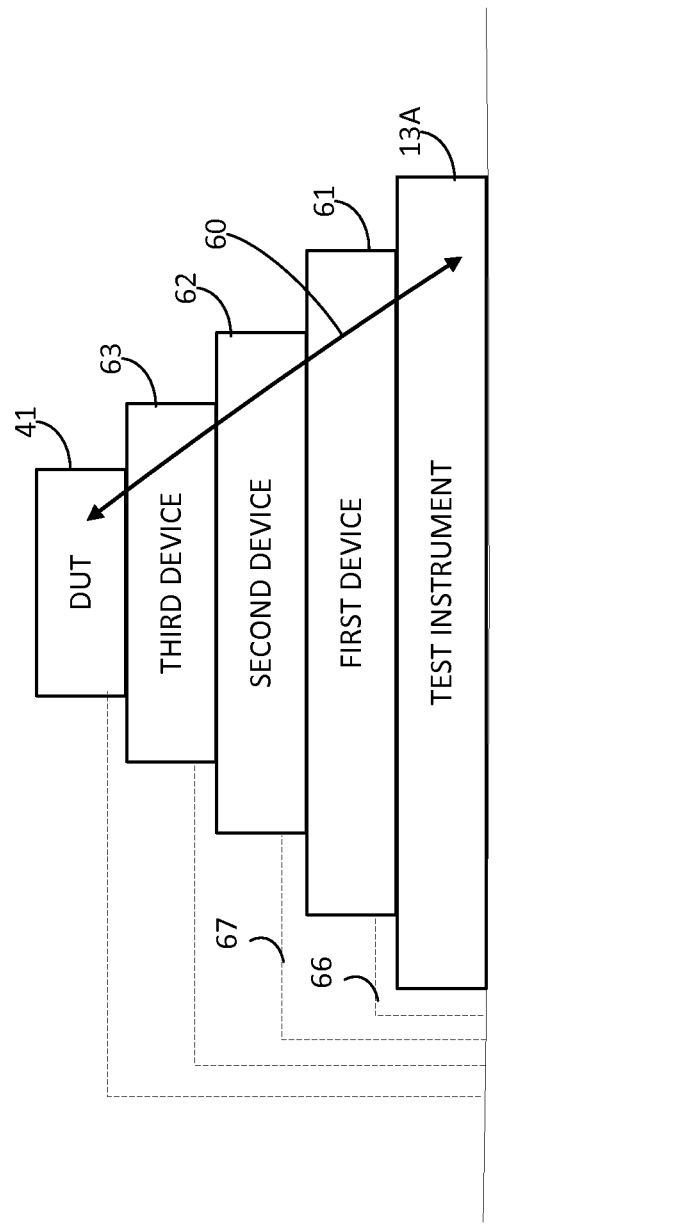
FIG. 5 is a block diagram showing, conceptually, multiple devices through which a transmission line passes between a test instrument and a DUT.

In some implementations, the characteristic of the transmission line includes the termination point of the transmission line. Referring, e.g., to FIG. 5, an example transmission line 60 extends from a test instrument 13A to a device under test, DUT 41, and passes through multiple devices, e.g., first second, and third devices 61, 62, 63 which are depicted conceptually in FIG. 5 as layers between test instrument 13A and DUT 42. These multiple devices may include various interfaces and circuit boards, such as DIB 16. In some implementations, detecting the extent of a signal path includes determining through which of the multiple devices the transmission line passes, and in which of those devices, if any, the transmission line terminates. For example, test computer 12 may be programmed with information identifying the electrical signal path length at each of devices 61, 62, 63. The known electrical path length may be at the entry point of each device, the exit point of each device, and/or at a point interior to each device. Knowing this information, and the determined electrical path length of the transmission line, the test computer may identify a device on a path between a test instrument and the DUT, where the transmission line terminates. With this information, the test computer may be able to identify that a problem, such as a circuit break, occurred and where it occurred.

In some implementations, determining which of the devices 61, 62, 63 that the transmission line passes through and terminates in includes: comparing a known value (e.g., electrical path length or capacitance) associated with one or more of the multiple devices to the determined electrical path length or capacitance; and identifying a device to which the transmission lines extends based on the comparing. For example, the test computer may compare the determined electrical path length or capacitance to electrical path length or capacitance 66 to first device 61, to electrical path length or capacitance 67 to second device 62, and so forth. Based on this comparison, the test computer determines the layer (e.g., the device) where the transmission line extends and terminates. If the test computer determines that the transmission line terminates at any point prior to its expected termination point (e.g., DUT 41), then the test computer may take appropriate action.

In this regard, knowing any of the foregoing characteristics of the transmission line, the test computer, or any other appropriate controller in the ATE, may coordinate and/or control repair of the transmission line. In some implementations, the test computer, or any other appropriate controller in the ATE, may redirect testing from one or more channels where faults, such as open or short circuits, are identified.

In some implementations, as indicated above, the electrical path lengths may be used to align timing between signals on different transmission lines (e.g., transmission lines 42, 43, 44 of FIG. 3). For example, if the electrical path lengths of different transmission lines are known based, e.g., on process 30, timing between signals on each transmission line may be adjusted so that, e.g., rising and/or falling edges of signals on a transmission line and one or more others of the transmission lines occur at a same time or within a specified interval at outputs of the transmission line and the one or more other transmission lines. In some implementations, timing may be controlled by controlling signal output from the test instruments. In some implementations, timing may be controlled by controlling circuitry along the transmission line so that appropriate timing is achieved.

The example test instruments described herein are configured both to send signals to a transmission line and to receive signals from a transmission line. In some implementations, the test instruments may be configured only to receive signals from the transmission line. These receive-only types of test instruments may be used with a separate PMU that outputs current to the transmission line. Furthermore, these receive-only types of test instruments are not generally capable of performing standard TDR, so the example processes described herein for determining electrical path length are useful for these types of test instruments. The same is true for drive-only types of test instruments.

While this specification describes example implementations related to "testing" and a "test system," the devices and processes described herein may be used in any appropriate system, and are not limited to test systems or to the example test systems described herein. For example, process 30 may be used in any appropriate technical context to determine transmission line length.

Testing, including performing process 30, may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing, including performing process 30, can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, includes an electrical connection and not necessarily a direct physical connection regardless of whether the word "electrical" is used to modify "connection". Any "connection" between structural components as used herein may imply a direct physical connection or a physical connection that includes intervening one or more intervening components or other structures.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method comprising:
    injecting current into a transmission line having a known capacitance per unit of length;
    determining a rate of change in voltage on the transmission line in response to the current;
    determining a capacitance of the transmission line based on the rate of change in voltage; and
    determining an electrical path length of the transmission line based on the determined capacitance of the transmission line and the known capacitance per unit of length;
    wherein the electrical path length is less than a rise time of a signal for which alignment is performed.

2. The method of claim 1, further comprising:
    performing signal alignment based on the electrical path length.

3. The method of claim 2, wherein performing signal alignment comprises controlling signal output to the transmission line and one or more other transmission lines so that rising and/or falling edges of signals on the transmission line and one or more other transmission lines occur at a same time or within a specified interval at outputs of the transmission line and the one or more other transmission lines.

4. The method of claim 1, wherein the transmission line comprises a signal path between a test instrument and a device under test.

5. The method of claim 4, wherein the signal path is on a device interface board that is configured to connect the test instrument to the device under test.

6. The method of claim 1, further comprising:
    detecting a characteristic of the transmission line based on the electrical path length.

7. The method of claim 6, wherein the characteristic of the transmission line comprises a termination point of the transmission line; and
    wherein detecting the termination point comprises determining through which of multiple devices the transmission line extends based on the capacitance or the electrical path length.

8. The method of claim 6, wherein the characteristic of the transmission line comprises a short circuit in a signal line that includes the transmission line; and
    wherein detecting the characteristic comprises recognizing that the capacitance or the electrical path length exceeds a predefined threshold.

9. The method of claim 6, wherein the characteristic of the transmission line comprises a break in a signal line that includes the transmission line; and
    wherein detecting the characteristic comprises recognizing that the capacitance or the electrical path length is below a predefined threshold.

10. The method of claim 7, wherein determining the termination point comprises:
    comparing a known value associated with one or more of the multiple devices to the determined electrical path length or the capacitance; and
    identifying a device to which the transmission line extends based on the comparing.

11. A system comprising:
    circuitry to inject current into a transmission line having a known capacitance per unit of length; and
    one or more processing devices to execute instructions to determine a rate of change in voltage on the transmission line in response to the current, to determine a capacitance of the transmission line based on the rate of change in voltage, and to determine an electrical path length of the transmission line based on the determined capacitance of the transmission line and the known capacitance per unit of length;
    wherein the electrical path length is less than a rise time of a signal for which alignment is performed.

12. The system of claim 11, wherein the one or more processing devices are programmed to detect a characteristic of the transmission line based on the electrical path length.

13. The system of claim 11, wherein the one or more processing devices are programmed to control signal alignment based on the electrical path length.

14. The system of claim 13, wherein controlling signal alignment comprises controlling signal output to the transmission line and one or more other transmission lines so that rising and/or falling edges of signals on the transmission line and one or more other transmission lines occur at a same time or within a specified interval at outputs of the transmission line and the one or more other transmission lines.

15. The system of claim 11, wherein the transmission line comprises a signal path between a test instrument and a device under test.

16. The system of claim 15, wherein the signal path is on a device interface board that is configured to connect the test instrument to the device under test.

17. The system of claim 12, wherein the characteristic of the transmission line comprises a termination point of the transmission line; and
    wherein detecting the termination point comprises determining through which of multiple devices the transmission line extends based on the capacitance or the electrical path length.

18. The system of claim 17, wherein determining the termination point comprises:
    comparing a value associated with one or more of the multiple devices to the determined electrical path length or the capacitance; and
    identifying a device to which the transmission line extends based on the comparing.

19. The system of claim 12, wherein the characteristic of the transmission line comprises a short circuit in a signal line that includes the transmission line; and
    wherein detecting the characteristic comprises recognizing that the capacitance or the electrical path length exceeds a predefined threshold.

20. The system of claim 12, wherein the characteristic of the transmission line comprises a break in a signal line that includes the transmission line; and
    wherein detecting the characteristic comprises recognizing that the capacitance or the electrical path length is below a predefined threshold.

\* \* \* \* \*